United States Patent
Muller et al.

(10) Patent No.: US 8,937,269 B2
(45) Date of Patent: Jan. 20, 2015

(54) THERMAL GENERATOR WITH MAGNETOCALORIC MATERIAL

(75) Inventors: Christian Muller, Strasbourg (FR); Jean-Claude Heitzler, Horbourg-Wihr (FR)

(73) Assignee: Cooltech Applications Societe par Actions Simplifee, Holtzheim (FR)

( * ) Notice: Subject to any disclaimer, the term of this patent is extended or adjusted under 35 U.S.C. 154(b) by 901 days.

(21) Appl. No.: 13/123,589

(22) PCT Filed: Oct. 13, 2009

(86) PCT No.: PCT/FR2009/001199
§ 371 (c)(1),
(2), (4) Date: Apr. 11, 2011

(87) PCT Pub. No.: WO2010/043781
PCT Pub. Date: Apr. 22, 2010

(65) Prior Publication Data
US 2011/0192836 A1    Aug. 11, 2011

(30) Foreign Application Priority Data
Oct. 14, 2008   (FR) ...................... 08 05666

(51) Int. Cl.
*H05B 6/10*    (2006.01)
*F25B 21/00*   (2006.01)
*H01L 37/04*   (2006.01)

(52) U.S. Cl.
CPC ............... *F25B 21/00* (2013.01); *H01L 37/04* (2013.01); *F25B 2321/0022* (2013.01); *Y02B 30/66* (2013.01)
USPC ........................................... 219/632

(58) Field of Classification Search
CPC .......... F25B 21/00; H01L 37/04; Y02B 30/66
USPC ................. 219/618, 672; 62/3.1, 6, 114, 335
See application file for complete search history.

(56) References Cited

U.S. PATENT DOCUMENTS 4,507,928 A * 4/1985 Johnson ........................... 62/3.1
6,332,323 B1 * 12/2001 Reid et al. ........................... 62/6
(Continued)

FOREIGN PATENT DOCUMENTS

FR        07/07612 A1    10/2007
FR        2 904 098 A1    1/2008
(Continued)

*Primary Examiner* — Thien S Tran
(74) *Attorney, Agent, or Firm* — Michael J. Bujold; Davis & Bujold, PLLC

(57) ABSTRACT

A heat generator comprising at least one thermal module comprising a magnetocaloric element crossed by a heat transfer fluid and two hot and cold chambers arranged on each side of the magnetocaloric element and containing a displacement device for directing the heat transfer fluid through the magnetocaloric element. A magnetic arrangement creates a magnetic field variation in each magnetocaloric element. A device for driving the displacement device, according to reciprocating movement in the concerned chamber, to displace the heat transfer fluid in synchronization with the magnetic field variation. The drive device contains a closed fluid circuit which connects the hot and cold chambers in which a working fluid is driven by a suction and discharge device. At least one switching interface is synchronized with the magnetic arrangement for alternately connecting each hot and cold chamber to suction and discharge sides of the suction and discharge device and inversely.

9 Claims, 4 Drawing Sheets

(56) References Cited

U.S. PATENT DOCUMENTS

| | | |
|---|---|---|
| 7,481,064 B2 | 1/2009 | Kitanovski et al. |
| 2007/0125095 A1* | 6/2007 | Iwasaki et al. .................. 62/3.1 |
| 2007/0130960 A1* | 6/2007 | Muller et al. .................. 62/3.1 |
| 2007/0186560 A1* | 8/2007 | Schauwecker et al. .......... 62/3.1 |
| 2007/0199332 A1* | 8/2007 | Muller et al. .................. 62/3.1 |
| 2008/0016907 A1* | 1/2008 | Barclay et al. ................. 62/612 |
| 2008/0236172 A1* | 10/2008 | Muller et al. .................. 62/3.1 |
| 2009/0320499 A1 | 12/2009 | Muller et al. |
| 2010/0095686 A1 | 4/2010 | Cramet et al. |
| 2010/0236258 A1 | 9/2010 | Heitzler et al. |

FOREIGN PATENT DOCUMENTS

| | | |
|---|---|---|
| FR | 2 914 051 A1 | 9/2008 |
| FR | 07/07612 | 9/2008 |
| WO | 2004/059221 A1 | 7/2004 |
| WO | 2005/093343 A1 | 10/2005 |
| WO | 2007/026062 A1 | 3/2007 |

* cited by examiner

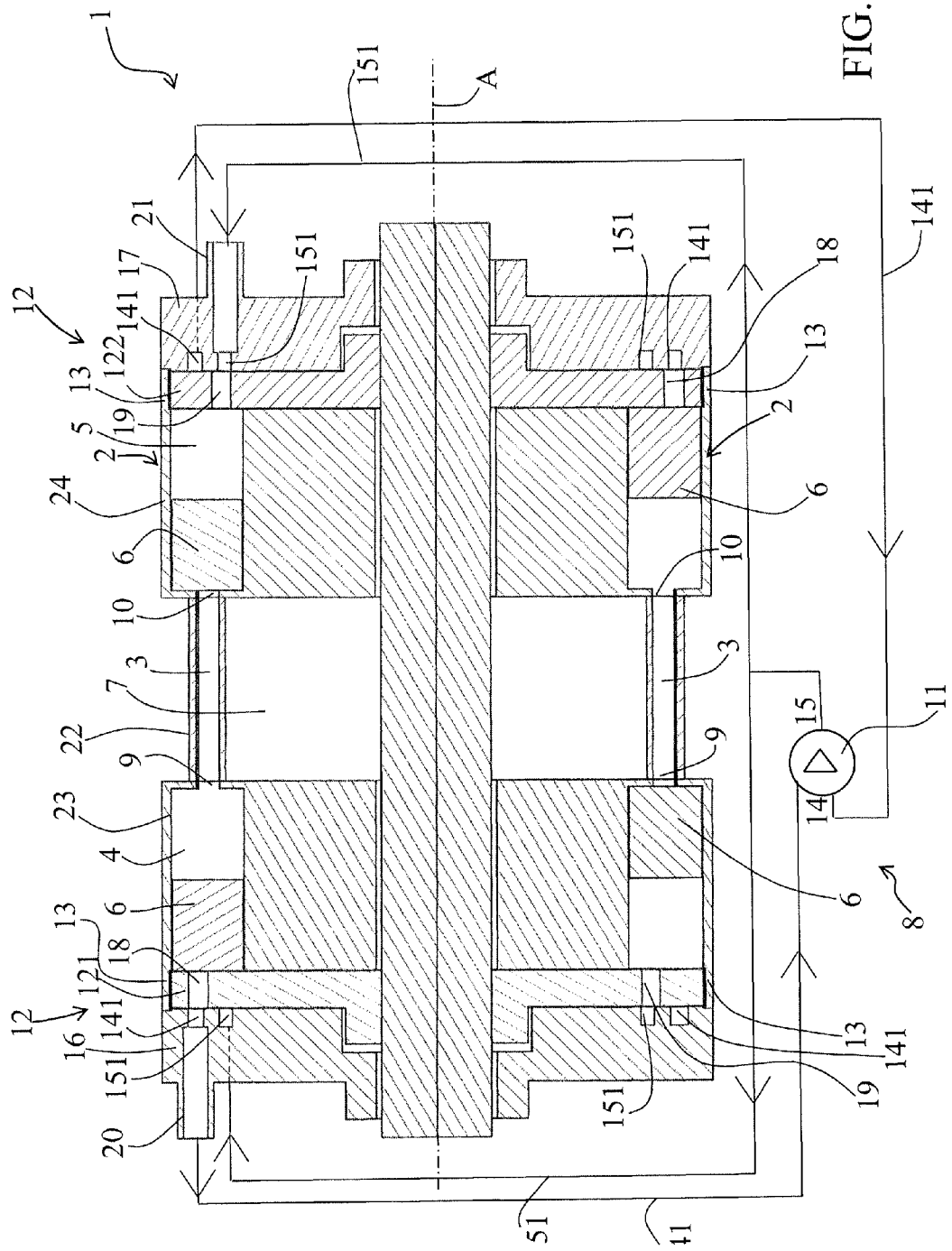

THERMAL GENERATOR WITH MAGNETOCALORIC MATERIAL

This application is a National Stage completion of PCT/FR2009/001199 filed Oct. 13, 2009, which claims priority from French patent application Ser. No. 08/05666 filed Oct. 14, 2008.

FIELD OF THE INVENTION

The present invention relates to a heat generator comprising at least one thermal module composed essentially of a magnetocaloric element arranged for being crossed by a heat transfer fluid and two hot and cold chambers arranged on each side of the magnetocaloric element and each containing a means for displacing the heat transfer fluid through the magnetocaloric element, a magnetic arrangement arranged for creating a magnetic field variation in the magnetocaloric element so as to alternately create in the magnetocaloric element a heating cycle and a cooling cycle, and a device for driving the displacement means according to a reciprocating movement in the concerned chamber for displacing the heat transfer fluid on either end of the magnetocaloric element in synchronization with the magnetic field variation in order to create and then maintain a temperature gradient between the two opposite ends of the magnetocaloric element.

BACKGROUND OF THE INVENTION

Magnetic refrigeration technology at ambient temperature has been known for more than twenty years and the advantages that it provides in terms of ecology and sustainable development are widely acknowledged. Its limits in terms of useful calorific output and efficiency are also well known. Consequently, all the research undertaken in this field is directed at improving the performance of such a generator, by adjusting the various parameters, such as the magnetization power, the performance of the magnetocaloric element, the heat exchange surface between the heat transfer fluid and the magnetocaloric elements, and the performance of the heat exchangers, etc.

The French patent application no. 07/07612 by the applicant describes a magnetocaloric generator in which the thermal energy generated by magnetocaloric elements is exchanged with a heat transfer fluid that is displaced through the magnetocaloric elements by circulation means. These circulation means are in the form of pistons that are driven with reciprocating movement by a control cam having a specific cam profile.

This generator however presents a disadvantage that is inherent to driving these pistons. In fact, this drive is subjected to the wear of the components in contact, that is, the cam profile and the pistons, which can result in a premature degradation of the generator efficiency. Moreover, it poses problems of sealing between the piston sleeves and the drive mechanism.

SUMMARY OF THE INVENTION

The present invention aims to overcome these disadvantages by proposing a magnetocaloric generator of a simple construction having a reduced number of constitutive components, in which, on the one hand, the risk of sealing loss between the chamber in which these means of fluid circulation move and the means of driving them are greatly limited and on the other hand, whose service life is increased and efficiency is preserved.

For this purpose, the invention concerns a heat generator with a drive device that comprises a closed fluid circuit establishing a fluidic connection between the hot and cold chambers in which the flow of fluid is driven by a suction and discharge device, and at least one switching interface synchronized with the magnetic arrangement for alternatively connecting each hot and cold chamber on the suction and discharge sides of the suction and discharge device and inversely.

The heat generator thus comprises a single device for driving the means of displacing the heat transfer fluid. The use of the switching interface allows avoiding the use of switching valves or other similar devices and thus facilitates the design of the heat generator. Besides, the integration of this interface in the heat generator, according to the invention, enables reducing the dimensions of the generator.

The heat generator according to the invention is designed for exchanging thermal energy with one or more external user circuits (heating, air-conditioning, tempering, etc.), being connected to them through a heat exchanger, for example.

According to the invention, the maneuvering fluid and the heat transfer fluid can be the same.

The switching interface can preferably comprise at least one switching plate mounted in the heat generator and inserted between one of the hot or cold chambers of the thermal module and a distribution flange fitted with a suction circuit and a discharge circuit which are connected respectively to the suction and discharge sides of the suction and discharge device.

The switching plate can comprise run-through passages which provide fluidic communication between the hot and cold chambers and the suction and discharge circuits of the distribution flange.

In a preferred embodiment of the invention, the heat generator may present a circular structure comprising several thermal modules arranged in a circle around a central axis.

In this configuration, it may comprise two switching interfaces, each with a switching plate, the switching plates and the corresponding distribution flanges may also be circular and the suction and discharge circuits of the distribution flanges may be in the form of two concentric grooves formed on their face in front of the switching plates.

In a first variant, the magnetic arrangement may be concentric to the central axis and driven in rotation around the axis, and the switching plates and the magnetic arrangement may be rotationally driven around the central axis by the same actuator. This configuration allows making the heat generator more compact.

In a second variant, the magnetic arrangement may be fixed and formed of electromagnets that are connected to an electrical power source and the switching plates may be rotationally driven around the central axis by a specific actuator.

In addition, the switching plates may be identical and mounted with an angular offset between each other so that each thermal module is connected, on the one side, at the level of its hot or cold chamber, to a run-through passage of a switching plate connected to the suction circuit of a distribution flange and, on the other side, at the level of its cold or hot chamber, to a run-through passage of the other switching plate connected to the discharge circuit of the other distribution flange.

By integrating identical switching plates, the manufacturing cost of the generator can be reduced.

With regard to the magnetic arrangement, it may comprise alternating magnetized zones and non-magnetized zones and the run-through passages of the switching plates may be arranged according to the alternation, for displacing the heat transfer fluid in each thermal module from the hot chamber to the cold chamber when the magnetocaloric element is not subjected to a magnetic field and from the cold chamber to the hot chamber when the magnetocaloric element is subjected to a magnetic field.

In addition, according to the invention, all the hot chambers and all the cold chambers may be contained in a housing that can form a heat exchanger.

BRIEF DESCRIPTION OF THE DRAWINGS

The present invention and its advantages will be better revealed in the following description of an embodiment given as a non limiting example, with reference to the enclosed drawings in which:

FIG. 2 is a longitudinal sectional view of the heat generator represented in FIG. 1.

DETAILED DESCRIPTION OF THE PREFERRED EMBODIMENTS

Figure 1:
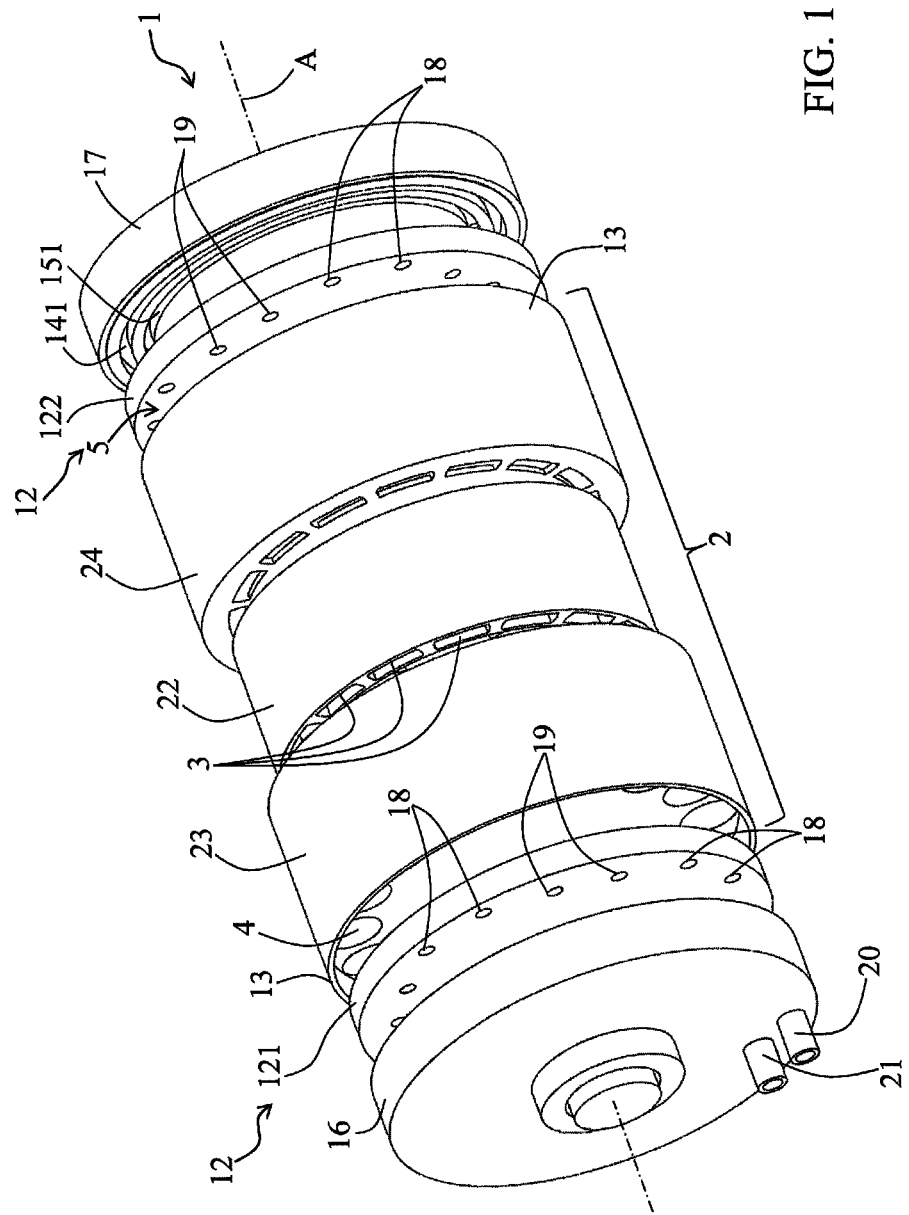
FIG. 1 is an exploded perspective view of a heat generator according to the invention.

With reference to the enclosed figures, the heat generator 1 is of an approximately circular configuration. It comprises several thermal modules 2 arranged in a circle around an axis A and each containing a magnetocaloric element 3 arranged between the two hot 4 and cold 5 chambers and two means 6 for displacing a heat transfer fluid through the magnetocaloric element 3. These means of displacement are in the form of pistons 6 (see FIG. 2) arranged in the hot 4 and cold 5 chambers, between the bottom of these chambers and the hot end 9 or cold end 10 of the magnetocaloric element 3.

The bottom of the hot 4 or cold 5 chambers means the end of the chamber opposite the magnetocaloric element 3.

The magnetocaloric element 3 allows for the flow of the heat transfer fluid and it may be made up of one or more magnetocaloric materials. It has open fluid passages that may be formed of the pores of porous material, mini or microchannels machined in a solid block or obtained by assembling superposed grooved plates, for example.

The heat generator 1 also contains a magnetic arrangement 7 with magnetized zones and non-magnetized zones, driven in rotation by an actuator (not represented) so as to submit each magnetocaloric element 3 to a magnetic field variation and create alternately, in each magnetocaloric element 3, a heating cycle and a cooling cycle. The pistons 6 are displaced synchronously with the magnetic arrangement 7 so as to circulate the heat transfer fluid alternately to each side of each magnetocaloric element 3 and to generate and maintain a temperature gradient between the two opposite ends 9 and 10 of each magnetocaloric element 3.

According to the invention, the pistons 6 are displaced by a drive device 8 containing a maneuvering fluid integrated in a closed circuit connecting the bottoms of the hot 4 and cold 5 chambers and that may or may not be different from the heat transfer fluid. Preferably, this maneuvering fluid of pistons 6 and the heat transfer fluid are identical so that possible leakage does not impede the operation of the heat generator 1.

The maneuvering fluid of pistons 6 is driven by a single continuous suction and discharge device 11. This device operates continuously and has a suction side 14 and a discharge side 15 to suck and discharge the maneuvering fluid continuously. Such a device may be a centrifugal pump, for example. It displaces the pistons 6 alternately in both directions of circulation by means of the two switching interfaces 12, each having a switching plate 121, 122 which respectively and alternately connects the bottom of the hot chambers 4 or cold chambers 5 to the suction circuits 141 and the discharge circuits 151 provided in the two corresponding distribution flanges 16 and 17 of the fluid. These circular distribution flanges 16 and 17 are arranged on each side of the thermal modules 2 and are fitted with connecting nozzles 20, 21 which facilitate their connection to the suction and discharge device 11. For this purpose, the connecting nozzle 20 of distribution flanges 16 and 17 connects their suction circuit 141 to the suction side 14 of the suction and discharge device 11 while the connecting nozzle 21 of the distribution flanges 16 and 17 connects their discharge circuit 151 to the discharge side 15 of the suction and discharge device 11.

Figure 4:
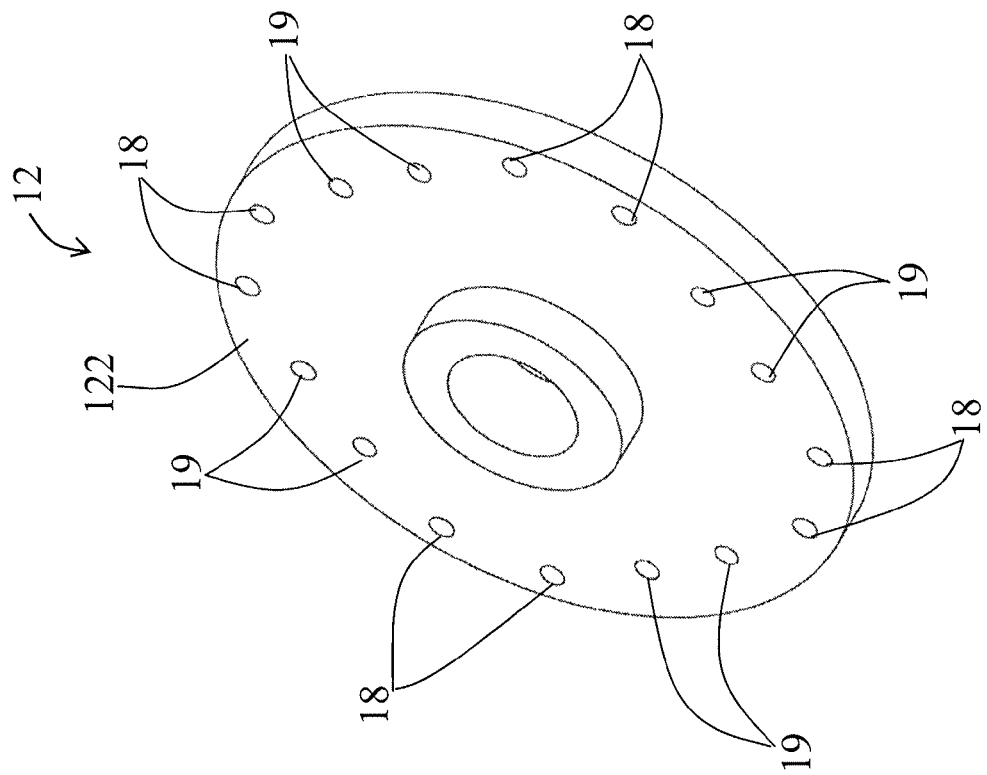
FIG. 4 is a perspective view of a switching plate of the heat generator represented in FIG. 1
Figure 3:
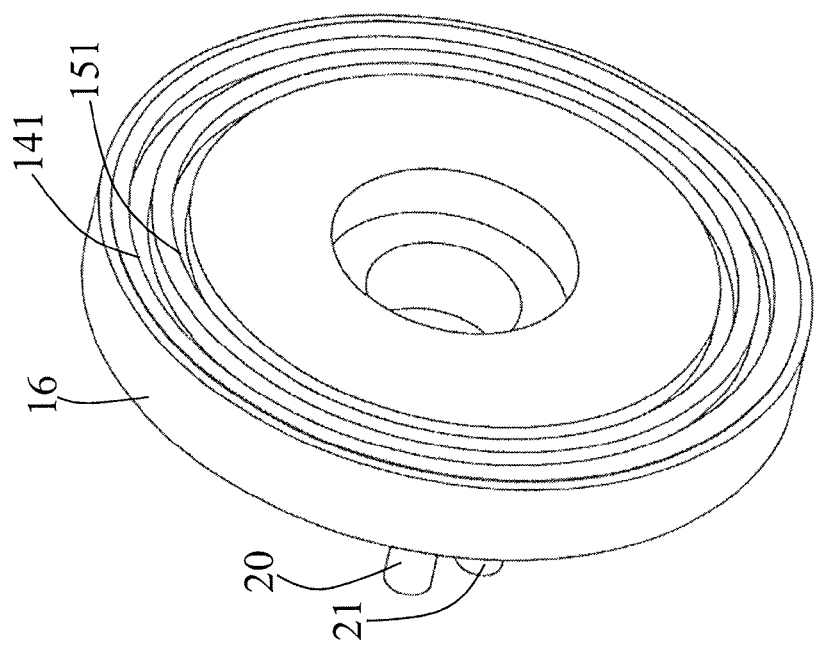
FIG. 3 is a perspective view of a distribution flange of the heat generator represented in FIG. 1.
Figure 5:
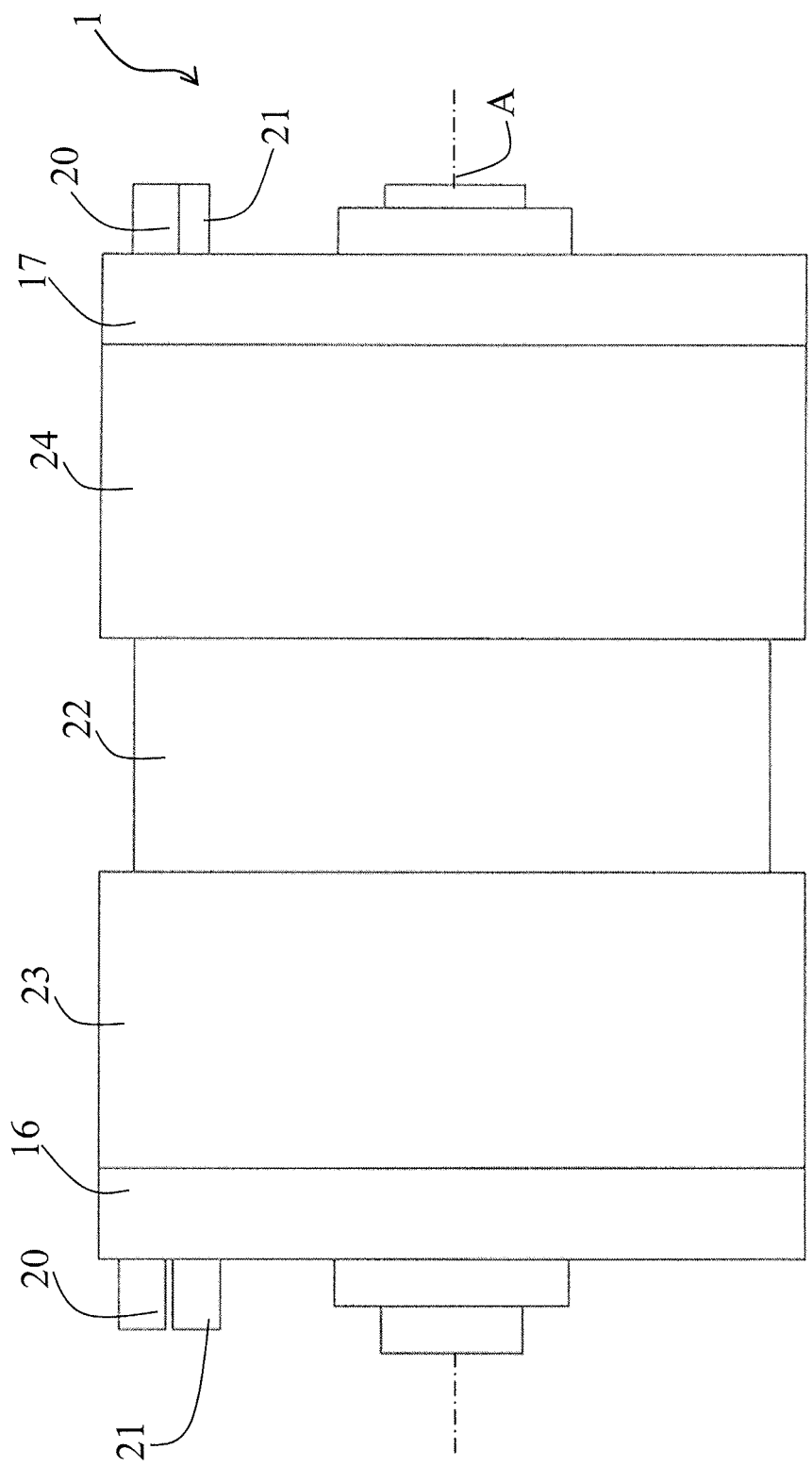
FIG. 5 is a lateral elevation view of the heat generator represented in FIG. 1.

These distribution flanges 16 and 17 cooperate with the switching plates 121 and 122, which are also circular and driven in rotation by the same actuator as that of the magnetic arrangement 7. They comprise run-through passages 18 and 19 for establishing communication alternately between the bottom of the hot chambers 4 and cold chambers 5 of the thermal modules 2 and the corresponding suction circuits 141 and discharge circuits 151 of the distribution flanges 16 and 17. The suction circuits 141 and the discharge circuits 151 of the distribution flanges 16 and 17 are formed by two concentric grooves (see FIG. 3) produced on their face and located in front of the switching plates 121 and 122 in the mounted position of the heat generator 1 and respectively facing the run-through passages 18 and 19 (see FIG. 4).

Of course, another configuration of the suction circuits 141 and the discharge circuits 151 can be contemplated without departing from the scope of protection of the invention. In this case, the switching plates 121 and 122 are also adapted for being able to co-operate with the circuits.

Similarly, in a configuration not represented, the magnetic arrangement may be realized with electromagnets that are subject to a variable electrical field and a specific actuator may be provided for rotating the switching plates 121 and 122.

Because of this, by considering for example the thermal module 2 represented on the top part of the FIG. 2, the heat transfer fluid contained within is displaced from right to left in the figure. For this purpose, a run-through passage 19 of the switching plate 122 connected to the discharge circuit 151 of the corresponding distribution flange 17 has positioned itself to face the cold chamber 5 while a run-through passage 18 of the switching plate 121 connected to the suction circuit 141 of the corresponding distribution flange 16 has positioned itself to face the hot chamber 4 of the same thermal module 2. The heat transfer fluid has thus passed through the magnetocaloric element 3 of the thermal module 2 of the cold chamber 5 towards the hot chamber 4, while the magnetic arrangement 7 was placed so as to subject the magnetocaloric element 3 to a magnetic field, inducing heating of the magnetocaloric element 3. During the passage of the heat transfer fluid through the magnetocaloric element 3, an exchange of heat has taken place between these and such that the fluid heated is up before reaching the corresponding hot chamber 4.

In the next cycle, after rotation of the magnetic arrangement 7 and the switching plates 121 and 122, the magnetocaloric element 3 of the thermal module 2 located in the top part of FIG. 2 will no longer be subject to a magnetic field and the fluid shall be displaced from left to right. For this purpose, the switching plates 121 and 122 will rotate so that a run-through passage 18 of the switching plate 122 connected to the suction circuit 141 of the corresponding distribution flange 17 will be positioned facing the cold chamber 5 while a run-through passage 19 of the switching plate 121 connected to the discharge circuit 151 of the corresponding distribution flange 16 will be positioned facing the hot chamber 4 of the same thermal module 2. The heat transfer fluid will pass through the magnetocaloric element 3 of the thermal module 2 from the hot chamber 4 towards the cold chamber 5, while the magnetocaloric element 3 cools down. The flow of the heat transfer fluid through the magnetocaloric element 3 will enable an exchange of heat between these which results in a cooling of the heat transfer fluid flowing towards the cold chamber 5.

The bottoms of the hot chambers 4 and cold chambers 5 are preferably open and the switching plates 121 and 122 provide their sealing. For this purpose, a housing 23 may contain the hot chambers 4 and a housing 24 may contain the cold chambers 5, and these housings 23 and 24 may each be fitted with a circular rim 13 which is designed for co-operating with the flank of the corresponding switching plate 121 or 122 for ensuring sealing between the switching plate 121 or 122 and the corresponding hot 4 or cold 5 chambers. A means of sealing such as a seal may also be placed between these components. Any other form of assembly and means of sealing may be envisaged.

These housings 23 and 24 are in contact with the hot 4 and cold 5 chambers and can therefore be used as heat exchangers.

In a variant not represented, a single housing may contain both hot 4 and cold 5 chambers as well as all the magnetocaloric elements 3 and comprise, at the level of each of its ends, the circular rim 13. Besides, such a housing may be composed of two half shells assembled according to a longitudinal plane of the heat generator 1.

In addition, the magnetocaloric elements 3 may also be integrated in a housing 22, as shown in the enclosed figures.

In the embodiment represented, the switching plates 121 and 122 are identical. They are in the form of solid disks with pairs of run-through passages 18, which are meant to be connected to the suction circuit 141, made at the height of or in front of it in the mounted position of the heat generator 1, and arranged alternately with pairs of run-through passages 19 which are meant for being connected to the discharge circuit 151 and made at the height of or in front of it in the mounted position of the heat generator 1. The switching plates 121, 122 are mounted in the heat generator 1 with an angular offset of 45°, this angle corresponding to the angle separating two consecutive magnetized zones of the magnetic arrangement 7. Such an arrangement enables changing the displacement direction of the pistons 6 and thus that of the heat transfer fluid at the level of each magnetocaloric element 3 of each thermal module 2 in synchronization with the variation of a magnetic field acting on the magnetocaloric element 3.

In other words, when the magnetocaloric element 3 of a thermal module 2 is subjected to a magnetic field and is heated, the switching plates 121 and 122 are arranged so as to drive the pistons 6 for displacing the heat transfer fluid from the cold chamber 5 to the hot chamber 4 in this thermal module 2. Inversely, when this same magnetocaloric element 3 is no longer subjected to a magnetic field and is cooling down, the switching plates 121 and 122 are arranged so as to drive the pistons 6 for displacing the heat transfer fluid from the hot chamber 4 to the cold chamber 5 in this thermal module 2.

The run-through passages 18 and 19 are constantly in fluidic relation with the suction circuits 141 and discharge circuits 151. Thus, when a run-through passage 18 or 19 is facing a hot chamber 4 or a cold chamber 5, it allows, by suction or discharge of the fluid, the displacement of the piston 6 located in this chamber.

Even though all the enclosed drawings illustrate a heat generator 1 with a single unit made up of an assembly of thermal modules 2 arranged in a circle around the central axis A, the invention also provides for the embodiment of a heat generator having a staged structure with several units. Such a configuration allows increasing the efficiency of the heat generator according to the invention.

Possibilities Of Industrial Application

This description shows clearly that the invention allows reaching the goals defined, that is to say it offers a heat generator 1 with a simple design and reduced dimensions limiting the number of moving parts for the circulation of the heat transfer fluid in the thermal modules 2 and resolving the problems of sealing due to the movement of the means for displacing the heat transfer fluid.

Such a heat generator 1 can be utilized in industrial as well as domestic applications, in the area of heating, air conditioning, tempering, cooling or others, at competitive costs and with reduced space requirements.

Furthermore, all parts making up this heat generator 1 can be manufactured according to reproducible industrial processes.

The present invention is not restricted to the example of embodiment described, but extends to any modification or variant which is obvious to a person skilled in the art while remaining within the scope of the protection defined in the attached claims.

The invention claimed is:

1. A heat generator (1) comprising:
  at least one thermal module (2) comprising a magnetocaloric element (3) arranged for being crossed by a heat transfer fluid, and
  hot (4) and cold (5) chambers being arranged on respective sides of the magnetocaloric element (3), and each containing a displacement means (6) for displacing the heat transfer fluid through the magnetocaloric element (3),
  a magnetic arrangement (7) being arranged for creating a magnetic field variation in the magnetocaloric element (3) to create alternately, in the magnetocaloric element (3), a heating cycle and a cooling cycle, and
  a drive device (8) for driving the displacement means (6) according to a reciprocating movement in the associated hot and cold chamber (4 or 5) for communicating a displacement to the heat transfer fluid on either of two opposite ends of the magnetocaloric element (3) in synchronization with the magnetic field variation to create and maintain a temperature gradient between the two opposite ends (9 and 10) of the magnetocaloric element (3), wherein the drive device (8) comprises a closed fluid circuit connecting fluidically the hot (4) and the cold (5) chambers in which a maneuvering fluid is driven by a suction and discharge device (11), and
  at least one switching interface (12) being synchronized with the magnetic arrangement (7) for alternately connecting each of the hot (4) and the cold (5) chambers to suction (14) and discharge (15) sides of the suction and discharge device (11) and inversely, and
  the switching interface (12) includes at least one switching plate (121 122) mounted in the heat generator (1) and inserted between one of the hot (4) and the cold (5) chambers of the thermal module (2), and a distribution flange (16, 17) is provided with a suction circuit (141) and a discharge circuit (151) connected respectively to the suction (14) and the discharge (15) sides of the suction and discharge device (11).

2. The heat generator according to claim 1, wherein the maneuvering fluid and the heat transfer fluid are the same fluid.

3. The heat generator according to claim 1, wherein the switching plate (121, 122) comprises run-through passages (18 and 19) which provide a fluidic communication between the hot (4) and the cold (5) chambers and the suction (141) and the discharge (151) circuits of the distribution flange (16, 17).

4. A heat generator (1) comprising:
   at least one thermal module (2) comprising a magnetocaloric element (3) arranged for being crossed by a heat transfer fluid,
   hot (4) and cold (5) chambers being arranged on respective sides of the magnetocaloric element (3), and each containing a displacement means (6) for displacing the heat transfer fluid through the magnetocaloric element (3),
   a magnetic arrangement (7) being arranged for creating a magnetic field variation in the magnetocaloric element (3) to create alternately, in the magnetocaloric element (3), a heating cycle and a cooling cycle,
   a drive device (8) for driving the displacement means (6) according to a reciprocating movement in the associated hot and cold chamber (4 or 5) for communicating a displacement to the heat transfer fluid on either of two opposite ends of the magnetocaloric element (3) in synchronization with the magnetic field variation to create and maintain a temperature gradient between the two opposite ends (9 and 10) of the magnetocaloric element (3), the drive device (8) comprises a closed fluid circuit connecting fluidically the hot (4) and the cold (5) chambers in which a maneuvering fluid is driven by a suction and discharge device (11),
   at least one switching interface (12) being synchronized with the magnetic arrangement (7) for alternately connecting each of the hot (4) and the cold (5) chambers to suction (14) and discharge (15) sides of the suction and discharge device (11) and inversely, and
   a circular structure comprises a plurality of thermal modules (2) circumferentially around a central axis (A), includes two switching interfaces (12) which each comprises a switching plate (121, 122), the switching plates (121 and 122) and corresponding distribution flanges (16, 17) are circular and the suction (141) and the discharge (151) circuits of the distribution flanges (16, 17) are in a form of two concentric grooves located on their face in front of the switching plates (121, 122).

5. The heat generator according to claim 4, wherein the magnetic arrangement (7) is concentric with the central axis (A) and driven in rotation around the axis (A), and the switching plates (121, 122) and the magnetic arrangement (7) are rotatably driven around the central axis (A) by a common actuator.

6. The heat generator according to claim 4, wherein the magnetic arrangement is fixed and comprises electromagnets connected to an electrical power source and the switching plates (121, 122) are rotationally driven around the central axis (A) by a specific actuator.

7. The heat generator according to claim 4, wherein the switching plates (121, 122) are identical and are mounted with an angular offset with respect to one another so that each thermal module (2) is connected, on one side, at a level of either the hot (4) or the cold (5) chamber, to a run-through passage (18) of one of the switching plates (121 or 122) connected to the suction circuit (141) of a distribution flange (16 or 17) and, on another side, at the level of either the cold (5) or the hot (4) chamber, to a run-through passage (19) of another of the switching plates (122 or 121) connected to the discharge circuit (151) of another distribution flange (17 or 16).

8. The heat generator according to claim 7, wherein the magnetic arrangement (7) comprises alternating magnetized zones and non-magnetized zones, and the run-through passages (18, 19) of the switching plates (121, 122) are arranged according to the alternation, for displacing the heat transfer fluid in each thermal module (2) from the hot chamber (4) to the cold chamber (5) when the magnetocaloric element (3) is not subjected to a magnetic field, and from the cold chamber (5) to the hot chamber (4), when the magnetocaloric element (3) is subjected to a magnetic field.

9. The heat generator according to claim 4, wherein all the hot chambers (4) and all the cold chambers (5) are contained within a housing (23, 24) and form a heat exchanger.

* * * * *